(12) United States Patent
Ohtsuki et al.

(10) Patent No.: US 7,525,327 B2
(45) Date of Patent: Apr. 28, 2009

(54) APPARATUS FOR EVALUATING SEMICONDUCTOR WAFER

(75) Inventors: Tsuyoshi Ohtsuki, Gunma (JP); Hideki Sato, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 79 days.

(21) Appl. No.: 11/659,532

(22) PCT Filed: Jun. 13, 2005

(86) PCT No.: PCT/JP2005/010761

§ 371 (c)(1),
(2), (4) Date: Feb. 6, 2007

(87) PCT Pub. No.: WO2006/016448

PCT Pub. Date: Feb. 16, 2006

(65) Prior Publication Data

US 2007/0273397 A1 Nov. 29, 2007

(30) Foreign Application Priority Data

Aug. 13, 2004 (JP) .............................. 2004-236078

(51) Int. Cl.
*G01R 31/26* (2006.01)
(52) U.S. Cl. ..................... 324/754; 324/158.1
(58) Field of Classification Search ............ None
See application file for complete search history.

(56) References Cited

U.S. PATENT DOCUMENTS 4,360,964 A * 11/1982 Gilly et al. ................. 438/10
5,872,017 A * 2/1999 Boydston et al. ........... 438/17
6,099,598 A * 8/2000 Yokoyama et al. ......... 29/25.01

FOREIGN PATENT DOCUMENTS

| GB | 2 020 827 A | 11/1979 |
|----|-------------|---------|
| JP | A 54-149590 | 11/1979 |
| JP | A 06-151552 | 5/1994  |
| JP | A 11-176896 | 7/1999  |
| JP | A 11-354514 | 12/1999 |
| JP | A 2001-060676 | 3/2001 |
| JP | A 2001-267384 | 9/2001 |

(Continued)

OTHER PUBLICATIONS

Cristoloveanu S. et al., "A Review of the Pseudo-MOS Transistor in SOI Wafers: Operation, Parameter Extraction, and Applications," 2000, IEEE Transactions on Electron Devices, vol. 47, No. 5.

(Continued)

*Primary Examiner*—Minh N Tang
(74) *Attorney, Agent, or Firm*—Oliff & Berridge, Plc.

(57) ABSTRACT

An apparatus for evaluating an electric characteristic of a semiconductor wafer including, at least, a wafer cassette section on which a wafer cassette for storing the semiconductor wafer that is an object to be evaluated is placed, a wafer pretreatment section for pretreating the semiconductor wafer in order to evaluate the electric characteristic thereof, a mercury probe section for evaluating the electric characteristic of the semiconductor wafer by using a mercury probe, and an automatic transport part for transporting the semiconductor wafer to each of the sections.

38 Claims, 5 Drawing Sheets

FOREIGN PATENT DOCUMENTS

| | | |
|---|---|---|
| JP | A 2003-100831 | 4/2003 |
| JP | A 2003-142452 | 5/2003 |
| JP | A 2004-507878 | 3/2004 |
| WO | WO 01/70438 A1 | 9/2001 |

OTHER PUBLICATIONS

Hovel H., "Si Film Electrical Characterization in SOI Substrates by the HgFET Technique," 2003, Solid State Electronics.

* cited by examiner

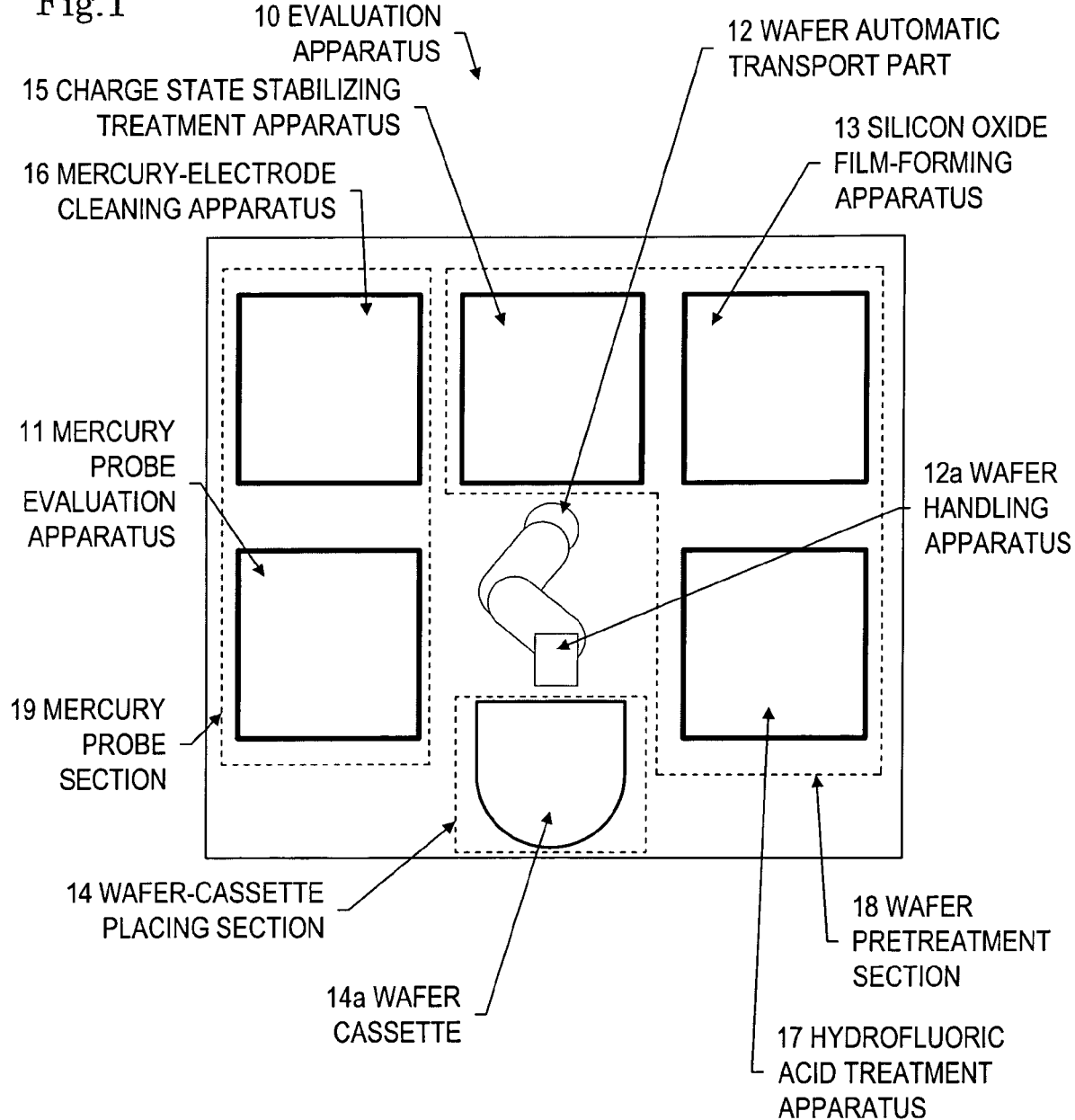
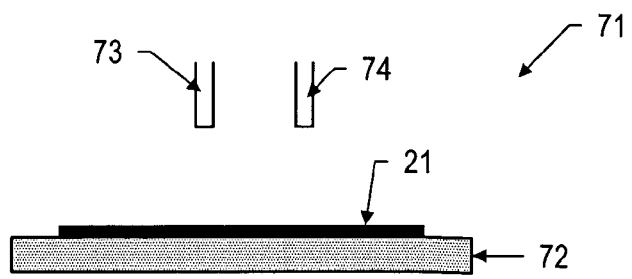

APPARATUS FOR EVALUATING SEMICONDUCTOR WAFER

TECHNICAL FIELD

The present invention relates to an evaluation apparatus for evaluating an electric characteristic of a semiconductor wafer, particularly, relates to an evaluation apparatus by using a mercury probe.

BACKGROUND ART

In recent years, as electronic devices have become finer and had higher performance, a semiconductor wafer of higher quality such as a silicon single crystal wafer or an epitaxial wafer or an SOI (Silicon On Insulator) wafer has been desired. An SOI wafer is a wafer having an SOI structure comprising, a support wafer, a buried oxide film (BOX layer) formed thereon, and an SOI layer (silicon-active layer) formed thereon. Because an electronic device is formed on a front surface side of each of these wafers, evaluation of quality has been actively performed with respect to, a surface layer of a silicon single crystal wafer or an epitaxial wafer, or an SOI layer of an SOI wafer. As one technique for the evaluation of quality, it has been performed that a MOS (Metal Oxide Semiconductor) structure is formed on the surface layer of a silicon single crystal wafer or an epitaxial wafer or on the surface of the SOI layer, and then the quality of the surface layer of the silicon single crystal wafer or the epitaxial wafer or the SOI layer is evaluated by applying voltage to an electrode portion thereof.

In order to form such a MOS structure on a surface layer of a silicon single crystal wafer or an epitaxial wafer, a silicon oxide film is formed on a main surface of each of the wafers, and a polysilicon layer is further grown thereon. And, by using a photolithography technique, the polysilicon layer is formed into a polysilicon electrode having a desired size. On the other hand, in the case of an SOI wafer, after forming an oxide film and a polysilicon layer, a polysilicon electrode is formed by using a photolithography technique, in the same manner. However, processing for earth connection from a surface thereof is required.

However, in order to form a MOS structure on a semiconductor wafer as described above, particularly in the case of an SOI wafer, a gate electrode and earth connection have to be formed on the main surface side thereof, and therefore, a large-scale apparatus and multiple steps such as a photolithography process are required and there are troubles such as large burden to cost and lack of rapidity.

Accordingly, there have been developed evaluation methods for evaluating a wafer more simply by using a mercury probe without forming a MOS structure on a semiconductor wafer by multiple steps as a conventional method. As one of the methods, a Pseudo MOS FET method in which an object to be evaluated is an SOI wafer has been proposed (see, for example, Japanese Patent Application Laid-open (kokai) No. 2001-60676, Japanese Patent Application Laid-open (kokai) No. 2001-267384, and S. Cristoleveanu et al., "A Review of the Pseudo-MOS Transistor in SOI Wafers: Operation, Parameter Extraction, and Applications" IEEE Trans. Electron Dev., 47 1018 (2000), H. J. Hovel, "Si film electrical characterization in SOI substrates by HgFET technique" Solid-State Electronics, 47, 1311 (2003)).

Hereinafter, the Pseudo MOS FET method will be explained by using an SOI wafer as an object wafer to be evaluated.

First, as shown in FIG. 11, on the side of an SOI layer 1 of an SOI wafer 8 to form a pseudo-MOS structure in, as electrodes for evaluation, needle probes or mercury probes are directly contacted, and they are set to be a drain electrode 6 and a source electrode 7. A back surface of the SOI wafer 8, namely, a back surface of a support wafer 3 is vacuum-sucked on a stage that is also used as an electrode or the wafer back surface is contacted with a needle, and thereby a gate electrode 4 is formed. Various electric characteristics can be obtained by applying voltage between these electrodes through a gate-voltage applying terminal 5 or the like. In this case, by cleaning the SOI wafer 8 with an aqueous solution containing hydrogen fluoride before the evaluation, a native oxide film formed on the surface of the SOI layer 1 can be removed, and therefore, by excluding effect of the native oxide film, it becomes possible to obtain more accurate electric characteristics.

In the evaluation method, it is preferable that mercury probes are used because a probe contact hole to be generated in contacting a needle probe on the surface of the SOI layer 1 is not formed and therefore, repeat measurements and a measurement in the vicinity of a first measured point can be performed easily.

In the case of the SOI wafer of P type, by performing the measurement with applying a gate voltage in the positive side, an electron mobility of the SOI layer 1 and an interface state density in the interface between the SOI layer 1 and the BOX layer 2 can be obtained. On the other hand, by performing the measurement with applying a gate voltage in the negative side, a hole mobility of the SOI layer 1 and a charge density of the BOX layer 2 can be obtained. In the case of performing the measurement with applying a gate voltage in the negative side, in order to accurately perform the measurement, it is necessary that, 10 hr or more passes after a native oxide film on the SOI layer surface is removed by cleaning the SOI wafer 8 with an aqueous solution containing hydrogen fluoride, and thereby an electric state of the SOI layer surface becomes stable, and then the measurement is performed.

Moreover, a mercury electrode of the mercury probe adsorbs contamination such as particles or metal impurities or organic impurities on the SOI layer in the evaluation, and therefore occasionally, the mercury constituting the electrode is gradually contaminated with containing impurities. If the mercury electrode is contaminated, an electric characteristic cannot be accurately evaluated, and therefore, it is necessary that the mercury electrode is subjected to cleaning of the mercury in getting to a predetermined frequency of use or a predetermined contamination frequency.

DISCLOSURE OF THE INVENTION

An object of the present invention is to provide an evaluation apparatus by which when an electric characteristic of a semiconductor wafer is evaluated, the electric characteristic of the semiconductor wafer or the like can be accurately evaluated with preventing contamination such as particles from adhering to a main surface of the semiconductor wafer and further the evaluation efficiency is high.

To achieve the above object, the present invention provides an apparatus for evaluating a semiconductor wafer in order to evaluate an electric characteristic thereof, comprising, at least, a wafer cassette section on which a wafer cassette for storing the semiconductor wafer that is an object to be evaluated is placed, a wafer pretreatment section for pretreating the semiconductor wafer in order to evaluate the electric characteristic thereof, a mercury probe section for evaluating the electric characteristic of the semiconductor wafer by using a mercury probe, and an automatic transport part for transporting the semiconductor wafer to each of the sections.

By such an evaluation apparatus, the semiconductor wafer that is an object to be evaluated being stored and waiting in the wafer cassette can be transported to the wafer pretreatment section by the automatic transport part and pretreated, and after the pretreatment, the wafer can be transported to the mercury probe section by the automatic transport part, and then, an electric characteristic thereof can be evaluated. In a conventional evaluation apparatus, when a pretreatment is performed, another treatment apparatus that is in another place outside the evaluation apparatus is used. However, the evaluation apparatus of the present invention has the wafer pretreatment section, and the steps from pretreatment of the semiconductor wafer to evaluation of an electric characteristic on the semiconductor wafer surface can be automatically performed in one evaluation apparatus. Therefore, without transporting the semiconductor wafer outside the apparatus, contamination including particles or metal impurities can be prevented from adhering to a main surface of the wafer, and an electric characteristic thereof can be more accurately evaluated. Moreover, because burdensome operations involved with transfer of the wafer to an outside treatment apparatus and so forth become not required, an evaluation time per one wafer can be shortened, and the evaluation efficiency can be improved.

In the above case, it is preferable that in the wafer pretreatment section, a native oxide film on a surface of the semiconductor wafer is removed as the pretreatment.

When a native oxide film on a surface of the semiconductor wafer is removed as the pretreatment in the wafer pretreatment section, the electric characteristic can be accurately evaluated by the removal of the native oxide film.

Moreover, it is preferable that in the wafer pretreatment section, a silicon oxide film is formed or a charge is loaded, on a surface of the semiconductor wafer as the pretreatment.

As described above, in the case of evaluating an electric characteristic with contacting a mercury probe with the semiconductor wafer, particularly in measuring the hole mobility of the SOI layer or the charge density of the buried oxide film with applying a gate voltage in the negative side, an electric state of a main surface of the wafer has not become stable and has not been capable of being accurately evaluated, without 10 hr or more passing after the native oxide film on the main surface of the semiconductor wafer is removed with an aqueous solution containing hydrogen fluoride. However, when a silicon oxide film is formed or a charge is loaded on a surface of the semiconductor wafer as the pretreatment in the wafer pretreatment section as described above, the electric state of the main surface can be rapidly stabilized by loading a charge on the main surface of the semiconductor wafer or by forming an extremely thin silicon oxide film. Therefore, in particular, the hole mobility or the charge density of the buried oxide film can be measured accurately and rapidly.

Moreover, it is preferable that the mercury probe section has a mercury-electrode cleaning means for cleaning a mercury electrode of the mercury probe.

Conventionally, the cleaning of mercury is performed by a trader taking over the mercury probe. However, when the mercury probe section has a mercury-electrode cleaning means for cleaning a mercury electrode of the mercury probe as described above, the cleaning of the mercury electrode can be performed without, detaching the mercury probe from the evaluation apparatus for the cleaning, attaching it again, and adjusting the evaluation apparatus after the attachment. Therefore, the cleaning time can be shortened and the operation efficiency of the apparatus can be improved.

Moreover, it is preferable that the wafer pretreatment section has a hydrofluoric acid treatment apparatus.

When the wafer pretreatment section has a hydrofluoric acid treatment apparatus, a native oxide film on the wafer surface can be suitably removed with hydrofluoric acid, and the electric characteristic can be accurately evaluated.

Moreover, it is preferable that the wafer pretreatment section has at least one of, a corona charge apparatus, a wafer heating apparatus, an ultraviolet irradiation apparatus, and a wafer cleaning apparatus.

When the wafer pretreatment section has a corona charge apparatus, positive or negative corona ions can be loaded on a main surface of the wafer. When the wafer pretreatment section has one of a wafer heating apparatus and an ultraviolet irradiation apparatus and a wafer cleaning apparatus, an extremely thin silicon oxide film can be formed on a main surface of the wafer. Therefore, the electric state such as a charge state of the main surface can be rapidly stabilized. In particular, a hole mobility or a charge density of the buried oxide film can be measured accurately and rapidly. Therefore, the evaluation efficiency is improved.

Moreover, it is preferable that by the hydrofluoric acid treatment apparatus, a hydrofluoric acid treatment with hydrofluoric acid, a cleaning treatment with pure water or heated pure water, and a subsequent drying treatment, can be performed.

When a hydrofluoric acid treatment and a cleaning treatment and a subsequent drying treatment can be performed by the hydrofluoric acid treatment apparatus as describe above, a series of native-oxide-film removing steps of, removing a native oxide film with hydrofluoric acid, performing cleaning with pure water or the like, and performing a subsequent drying treatment, can be performed rapidly and without burdensome transport of the wafer.

Moreover, it is preferable that the wafer cleaning apparatus has at least one tank of, a treatment tank of ozone water, a treatment tank of aqueous solution containing ammonium and hydrogen peroxide, a treatment tank of hydrogen peroxide solution, a treatment tank of aqueous solution containing hydrogen chloride and hydrogen peroxide, a treatment tank of aqueous solution containing sulfuric acid and hydrogen peroxide, and a treatment tank of oxidizing aqueous solution containing oxidizing aqueous solution.

When the wafer cleaning apparatus has at least one of the above-described treatment tanks of aqueous solution, by cleaning by using these aqueous solutions, an extremely-thin uniform silicon oxide film can be formed on a main surface of the semiconductor wafer. Therefore, the electric state of the wafer main surface can be rapidly stabilized. In particular, the hole mobility or a charge density of the buried oxide film can be measured accurately and rapidly. Therefore, the evaluation efficiency is improved.

Moreover, it is preferable that the oxidizing aqueous solution is electrolyzed anode water.

When the oxidizing aqueous solution is electrolyzed anode water, an extremely-thin uniform silicon oxide film can be formed more rapidly on a main surface of the wafer because the electrolyzed anode water contains components being capable of rapidly forming a silicon oxide film on a semiconductor wafer surface, such as $OH^-$ ions.

According to the evaluation apparatus of the present invention, an electric characteristic or the like of the wafer can be accurately evaluated with preventing contamination such as particles from adhering to a main surface of the semiconductor wafer, and furthermore, the evaluation efficiency can be improved. Moreover, burdensome operations involved with cleaning of the mercury probe can be omitted and the operation efficiency of the evaluation apparatus can be enhanced.

BRIEF EXPLANATION OF THE DRAWINGS

FIG. 1 is an upper-side schematic view showing a schematic seen from the upper side of the evaluation apparatus of the present invention.

FIG. 2 is a schematic view showing an example of a constitution of the hydrofluoric acid treatment apparatus.

BEST MODE FOR CARRYING OUT THE INVENTION

Figure 3:
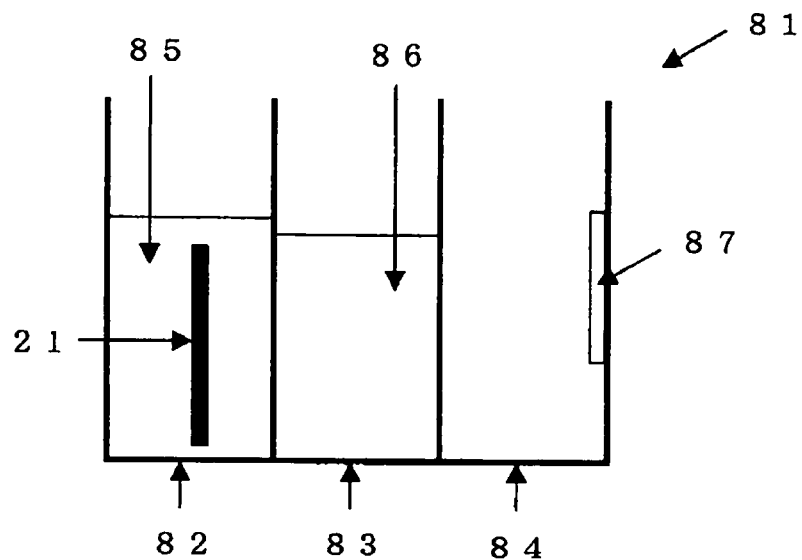
FIG. 3 is a schematic view showing another example of a constitution of the hydrofluoric acid treatment apparatus.

Hereinafter, embodiments of the present invention will be explained specifically with reference to the appended drawings. However, the present invention is not limited thereto.

FIG. 1 is an upper-side schematic view showing a schematic seen from the upper side of the evaluation apparatus of the present invention. The evaluation apparatus 10 comprises, a wafer-cassette placing section 14 on which a wafer cassette 14a for storing a semiconductor wafer that is an object to be evaluated is placed, a wafer pretreatment section 18 for pretreating the semiconductor wafer in order to evaluate the electric characteristic thereof, a mercury probe section 19 for evaluating the electric characteristic of the semiconductor wafer by using a mercury probe, and a wafer automatic transport part 12 for transporting the semiconductor wafer to each of the sections by a wafer handling apparatus 12a.

It is preferable that in the wafer pretreatment section 18, a native oxide film on a surface of the semiconductor wafer is removed as the pretreatment. For example, the section can have a hydrofluoric acid treatment apparatus 17. Moreover, it is preferable that an extremely thin silicon oxide film is formed or a charge is loaded, on a surface of the semiconductor wafer as the pretreatment. For example, it is preferable the section has a silicon oxide film forming apparatus 13 and/or a charge state stabilizing treatment apparatus 15. Moreover, it is preferable that the mercury probe section 19 has a mercury-electrode cleaning apparatus 16 for cleaning a mercury electrode of the mercury probe as well as a mercury-probe evaluation apparatus 11 having the mercury probe.

According to the present evaluation apparatus, the apparatuses for the pretreatment and the evaluation of the electric characteristic and the cleaning of the mercury electrode are integrated in the evaluation apparatus. Therefore, prevention of adherence of the contamination, measurement efficiency, and operation efficiency of the apparatus, can be improved.

Hereinafter, a specific constitution of each of the sections of the evaluation apparatus 10 will be explained with a method for evaluating an electric characteristic by using it.

The evaluation apparatus 10 has a top plate (not shown), and a clean filter such as HEPA filter for removing particles is provided therein. Therefore, the inside of the apparatus can be prevented from being contaminated with particles. Moreover, in order to prevent boron contamination or the like from the filter, a chemical filter may be further provided. As a wafer of an object to be evaluated, an SOI wafer is possible, and a wafer which a silicon oxide film and a polysilicon layer are formed above a main surface of a silicon single crystal wafer or an epitaxial wafer is also possible (hereinafter, referred to as a wafer including the both cases). First, a plurality of the wafers are stored in the wafer cassette 14a, and it is placed on the wafer-cassette placing section 14.

After the wafer cassette 14a is placed on the wafer-cassette placing section 14, the wafer handling apparatus 12a takes out one wafer from the cassette 14a and transports it to the hydrofluoric acid treatment apparatus 17. In the wafer automatic transport part 12, the wafer handling apparatus 12a holds and transports the wafer by a means such as sucking or edge handling. It is preferable that in the wafer handling apparatus 12a, a portion thereof contacting the wafer is made of resin, or is made of metal with the surface thereof coated with resin. Such a wafer handling apparatus 12a can be suitably used because trouble of corrosion is not caused when the apparatus is exposed to hydrogen fluoride to vaporize from an aqueous solution containing hydrogen fluoride in the hydrofluoric acid treatment apparatus 17. In addition, it is preferable that the resin is material having chemical resistance such as fluorine resin.

Next, a native oxide film on the wafer main surface is removed by the hydrofluoric acid treatment apparatus 17. It is preferable that by the hydrofluoric acid treatment apparatus 17, a hydrofluoric acid treatment, a cleaning treatment with pure water or heated pure water, and a subsequent drying treatment, can be performed. As such an apparatus, there can be used such a hydrofluoric acid treatment apparatus 71 as shown in FIG. 2, comprising, a vacuum chuck 72 sucking the wafer, a drop apparatus 73 for dropping an aqueous solution containing hydrogen fluoride on a main surface of the wafer, a nozzle 74 for spraying pure water on the main surface of the wafer. In the case of treating wafers one-by-one by the apparatus, for example, the treatment is performed as follows. First, the wafer 21 transported to the hydrofluoric acid treatment apparatus 71 is sucked by the vacuum chuck 72 provided inside the hydrofluoric acid treatment apparatus 71. Next, an aqueous solution, for example, containing 1-wt % hydrogen fluoride is dropped on the main surface of the wafer 21 by the drop apparatus 73. In this case, the aqueous solution is dropped by an amount thereof by which the entire main surface of the wafer 21 is in contact with the aqueous solution by the surface tension. After a predetermined amount of the aqueous solution is dropped, the wafer 21 is held as it is, for the time for removing a native oxide film on the main surface thereof, or more. Then, the vacuum chuck is rotated by a motor (not shown) connected to the vacuum chuck. The wafer 21 is also rotated with rotation of the vacuum chuck, and the aqueous solution containing hydrogen fluoride on the main surface of the wafer 21 is removed. Next, along with rotating the wafer 21, pure water is sprayed on the main surface of the wafer 21 by the nozzle 74 and thereby the wafer is cleaned. In this case, hot pure water heated at a desired temperature by housing the pure water heating apparatus in the evaluation apparatus 10 can be used to enhance the cleaning effect. Last, along with rotating the wafer 21, the drying is performed by stopping supply of pure water. As described above, by performing the hydrofluoric acid treatment and the cleaning with pure water and the subsequent drying, it becomes possible that the native oxide film is rapidly removed.

As another example of the hydrofluoric acid treatment apparatus 17, like a hydrofluoric acid treatment apparatus 81 shown in FIG. 3, an apparatus into which three treatment tanks of an aqueous solution tank 82 containing hydrogen fluoride and a pure water cleaning tank 83 and a drying treatment tank 84 are incorporated is used, and thereby the wafer can also be subjected to hydrofluoric acid treatment by immersing the wafer in the treatment tanks or the like. That is, the wafer 21 is transported to the hydrofluoric acid treatment apparatus 81 by the wafer automatic transport part 12. And, along with holding the wafer 21 by an edge handler (not shown) for handling the edge of the wafer 21, the wafer 21 was immersed together with the edge handler in the aqueous solution 85 containing hydrogen fluoride in the aqueous solution tank 82 containing hydrogen fluoride. After immersing the wafer 21 for the time or more for being capable of removing the native oxide film, the wafer 21 is pulled up together with the handler, and subsequently immersed in pure water 86 in the pure water cleaning tank 83. After the cleaning is ended, the wafer is put in the drying treatment tank 84 in the same manner, and dried with a clean dry air blowing on a surface of the wafer 21 by a dryer 87 provided therein. Because such a treatment tank for a single wafer processing does not take a large space in the apparatus, the tank can be suitably placed in the apparatus.

After the treatment by the hydrofluoric acid treatment apparatus 17, namely, the removal of a native oxide film on the wafer surface is ended, the wafer is transported again by the wafer automatic transport part 12, and placed on the charge state stabilizing treatment apparatus 15 for stabilizing charge state of the main surface of the wafer to be an object to be evaluated, which is provided in the wafer pretreatment section 18. As the charge state stabilizing treatment apparatus 15, for example, a corona charge apparatus can be used.

Figure 4:
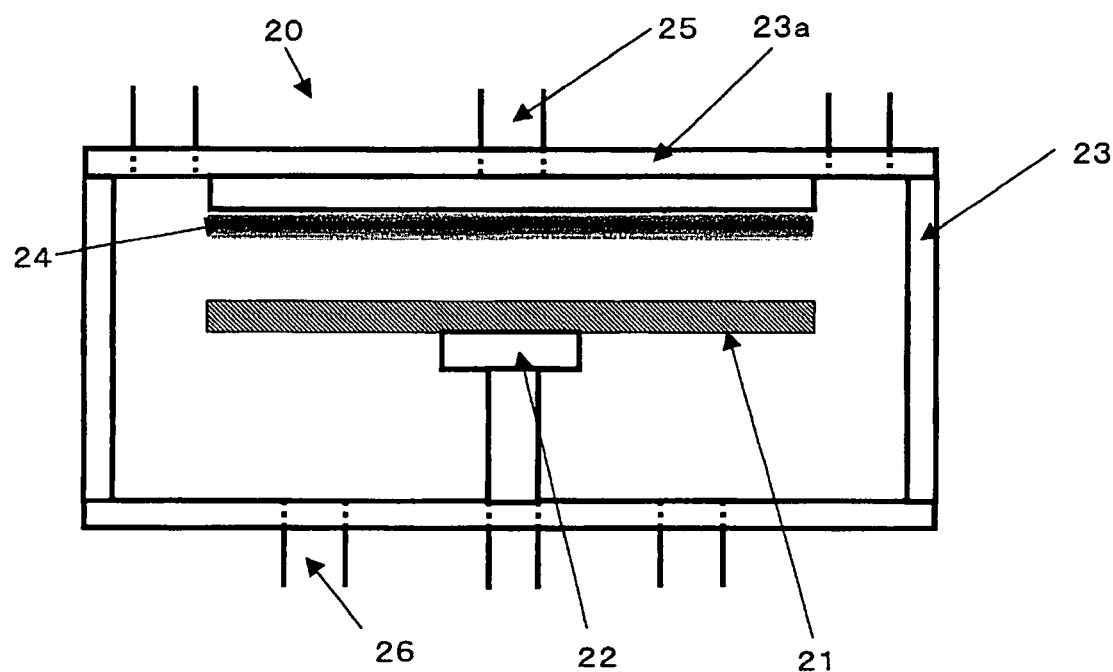
FIG. 4 is a schematic view showing an example of a constitution of the corona charge apparatus.

FIG. 4 is a schematic view showing an example of a constitution of the corona charge apparatus. The corona charge apparatus 20 comprises, a vacuum chuck 22 sucking the wafer 21, a chamber 23, a charge generation electrode 24, a gas supply duct 25, and a gas exhaust duct 26. After the wafer 21 is transported thereto by the wafer automatic transport part 12, the vacuum chuck 22 is raised with opening a top plate 23a of the chamber 23. And, the wafer 21 is placed on the vacuum chuck 22 and chucked, and then the vacuum chuck 22 is lowered. Next, the top plate 23a is closed, and a positive or negative high voltage is applied to the charge generation electrode 24. Positive or negative corona ions generated thereby are loaded on a main surface of the wafer 21, and thereby an electric state of the main surface is stabilized. It is preferable that the charge amount in this case is 500 nC/cm$^2$ to 50000 nC/cm$^2$ in order to rapidly stabilize the charge state.

In this case, the positive corona ion is occasionally in a state of $(H_2O)_nH^+$ that water molecules in the air gather around the $H^+$ ion. Therefore, positive corona ions can be loaded on the main surface of the wafer 21 without using the chamber 23. On the other hand, it is difficult to generate negative corona ions in the air. However, a carbon dioxide gas is introduced from the gas supply duct 25 and filled in the chamber 23, and carbon dioxide gas ions $CO_2^-$ are generated by applying a negative high voltage, and thereby the negative corona ions can be loaded on the main surface of the wafer 21. Therefore, in this case, it is preferable to use the chamber 23.

After a charge is loaded on a main surface of the wafer 21 as described above, the wafer 21 is taken out of the chamber 23.

For stabilizing the charge state of the main surface of the wafer 21, it is possible that a charge is loaded on the main surface of the wafer 21 by using a charge state stabilizing treatment apparatus 15 such as the above-described corona charge apparatus 20, or that an extremely thin silicon oxide film having a uniform thickness, such as 5 nm or less, can formed on the main surface of the wafer 21. For forming the silicon oxide film on the main surface of the wafer 21, a silicon oxide film forming apparatus 13 may be provided in the evaluation apparatus 10 instead of the charge state stabilizing treatment apparatus 15. Or, the charge state stabilizing treatment apparatus 15 is provided as it is and the silicon oxide film forming apparatus 13 may be additionally provided. As such a silicon oxide film forming apparatus 13, at least one of, a wafer heating apparatus, an ultraviolet irradiation apparatus, and a wafer cleaning/drying treatment apparatus, can be used.

Figure 5:
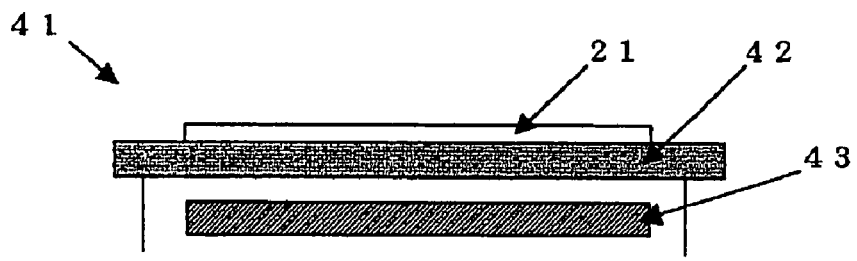
FIG. 5 is a schematic view showing an example of a constitution of the wafer heating apparatus.

As the wafer heating apparatus, for example, an apparatus having a constitution as FIG. 5 may be used. The wafer heating apparatus 41 in FIG. 5 has a constitution that a heater 43 is attached under a flat metal plate 42 subjected to a surface treatment. And, for example, the wafer 21 is placed on the metal plate 42 and the wafer 21 is heated at a desired temperature with the heater 43, and thereby the silicon oxide film having an extremely thin and uniform thickness can be formed on the main surface of the wafer 21. In addition, the atmosphere around the wafer heating apparatus 41 may be an air. However, if a mixed atmospheric gas of oxygen and nitrogen, the silicon oxide film can be suitably formed. If the heat treatment temperature is approximately 50° C. to 350° C., the silicon oxide film having an extremely thin and uniform thickness can be suitably formed.

Figure 6:
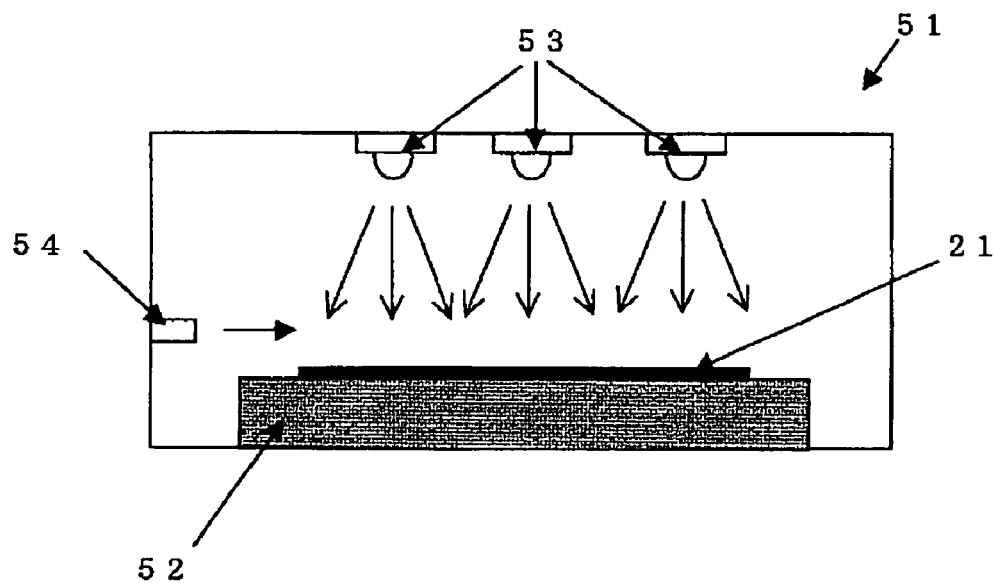
FIG. 6 is a schematic view showing an example of a constitution of the ultraviolet irradiation apparatus.

Moreover, as the ultraviolet irradiation apparatus, for example, an apparatus having a constitution as FIG. 6 can be used. In the ultraviolet irradiation apparatus 51 in FIG. 6, a stage 52 is placed on the lower side inside the apparatus, and on the upper side thereinside, an ultraviolet generating lamp 53 such as a mercury lamp is placed. Moreover, an atmospheric-gas supply duct 54 for supplying a gas inside the apparatus is provided. The wafer 21 is placed on the stage 52, and a main surface of the wafer 21 is irradiated with ultraviolet rays by the ultraviolet generating lamp 53, and thereby a silicon oxide film having an extremely thin and uniform thickness is formed. The formation of the silicon oxide film by ultraviolet rays is performed by the process that, the ultraviolet rays reacts with an oxygen molecule in the atmosphere to generate oxygen radicals, the oxygen radical reacts with an oxygen molecule to generate ozone, the ozone reacts with the ultraviolet rays to be decomposed to generate an excited oxygen atom, and the excited oxygen atom reacts with silicon on the wafer surface to form the silicon oxide film. The wavelength of the ultraviolet rays is 184.9 nm or 253.7 nm in the case of using a mercury lamp. However, any wavelength thereof is possible as long as being capable of forming a silicon oxide film on the wafer main surface by the above-described formation process. Moreover, the lamp for generating the ultraviolet rays is not limited to the mercury probe, and any lamp is possible as long as the ultraviolet rays being capable of initiating the above-described formation process can be generated.

In this case, for forming a silicon oxide film by ultraviolet treatment, the atmosphere in the apparatus is required to contain oxygen. It is sufficient that the atmosphere containing oxygen contains an oxygen amount being capable of forming a silicon oxide film on a main surface of the wafer. However, if an air is used as the atmosphere containing oxygen, the atmospheric gas is not required to be supplied from an atmospheric-gas supply duct 54. On the other hand, for example, if the atmosphere having a higher oxygen partial pressure than that of an air is used for rapidly forming a silicon oxide film, the atmospheric gas may be supplied from the atmospheric-gas supply duct 54. In particular, it is preferable that the atmospheric gas having 100% oxygen is supplied because a silicon oxide film having an extremely thin and uniform thickness can be formed very rapidly.

Figure 7:
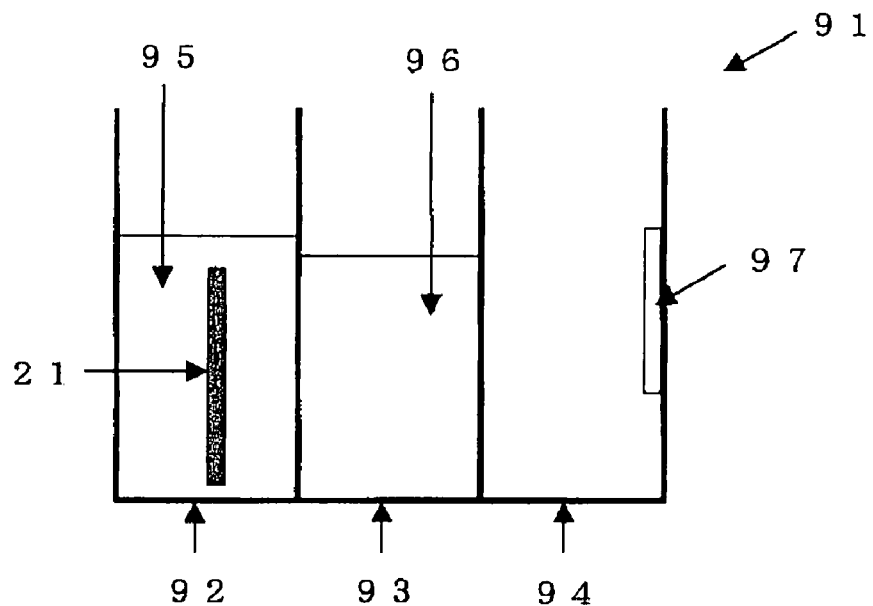
FIG. 7 is a schematic view showing an example of a constitution of the wafer cleaning apparatus.

Furthermore, in the case of using a wafer cleaning apparatus, for example, as shown in FIG. 7, a wafer cleaning apparatus 91 having three treatment tanks in the same manner as the hydrofluoric acid treatment tank 17. The wafer cleaning apparatus 91 comprises, a chemical solution tank 92 that is a treatment tank for forming a silicon oxide film, a pure water cleaning tank 93, and a drying treatment tank 94. In the chemical solution tank 92, an aqueous solution having components being capable of forming an extremely thin silicon oxide film having a uniform film thickness on a main surface of the wafer is charged as a chemical solution 95. As such an aqueous solution, it is possible to select at least one of, ozone water, aqueous solution containing ammonium and hydrogen peroxide, hydrogen peroxide solution, aqueous solution containing hydrogen chloride and hydrogen peroxide, aqueous solution containing sulfuric acid and hydrogen peroxide, and oxidizing aqueous solution. If the wafer is treated by using these aqueous solutions, an oxide film having an extremely thin and uniform thickness can be formed on the main surface. Moreover, it is preferable that as the oxidizing aqueous solution, a highly oxidizing aqueous solution having a high oxidation-reduction potential (For example, the oxidation-reduction potential is +300~+1200 mV) is used. For example, electrolyzed anode water (approximately pH 2-6) can be used. In addition, under the condition that an extremely thin silicon oxide film having a uniform film thickness can be formed on a main surface of the wafer, the component ratio of the chemical solution or the chemical solution temperature is not particularly limited. Moreover, it is preferable that an exhaust duct is provided in the same manner as the hydrofluoric acid treatment apparatus 17 because there is no fear that the mercury-probe evaluation apparatus 11 or the wafer automatic transport part 12 is exposed to vaporizing chemical components.

When such a wafer cleaning apparatus 91 is used, the wafer 21 is transported to the chemical solution tank 92 by the wafer automatic transport part 12, and along with holding the wafer 21 by an edge handler (not shown) for handling the edge of the wafer 21, the wafer 21 was immersed together with the edge handler in the chemical solution 95 in the chemical solution tank 92. After immersing the wafer 21 for the time for being capable of forming a silicon oxide film, the wafer 21 is pulled up together with the handler, and subsequently immersed in pure water 96 in the pure water cleaning tank 93. After the cleaning is ended, the wafer 21 is put in the drying treatment tank 94 in the same manner, and dried with a clean dry air blowing on a surface of the wafer 21 by a dryer 97 provided therein. Because such a treatment tank for a single wafer processing does not take a large space in the apparatus, the tank can be suitably placed in the apparatus.

Figure 8:
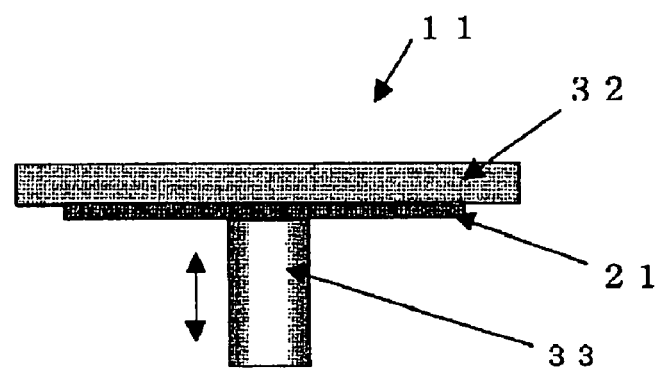
FIG. 8 is a schematic view showing a constitution of the mercury-probe evaluation apparatus.
Figure 9:
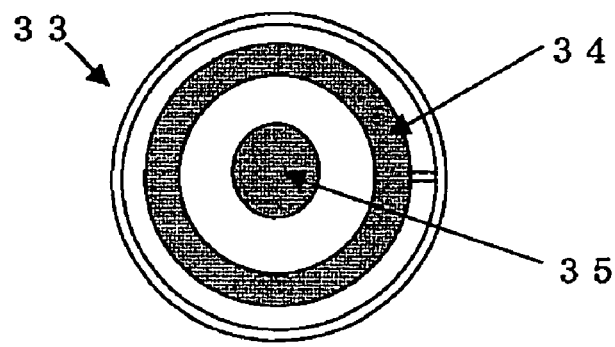
FIG. 9 is a view showing a shape of the mercury electrode.
Figure 11:
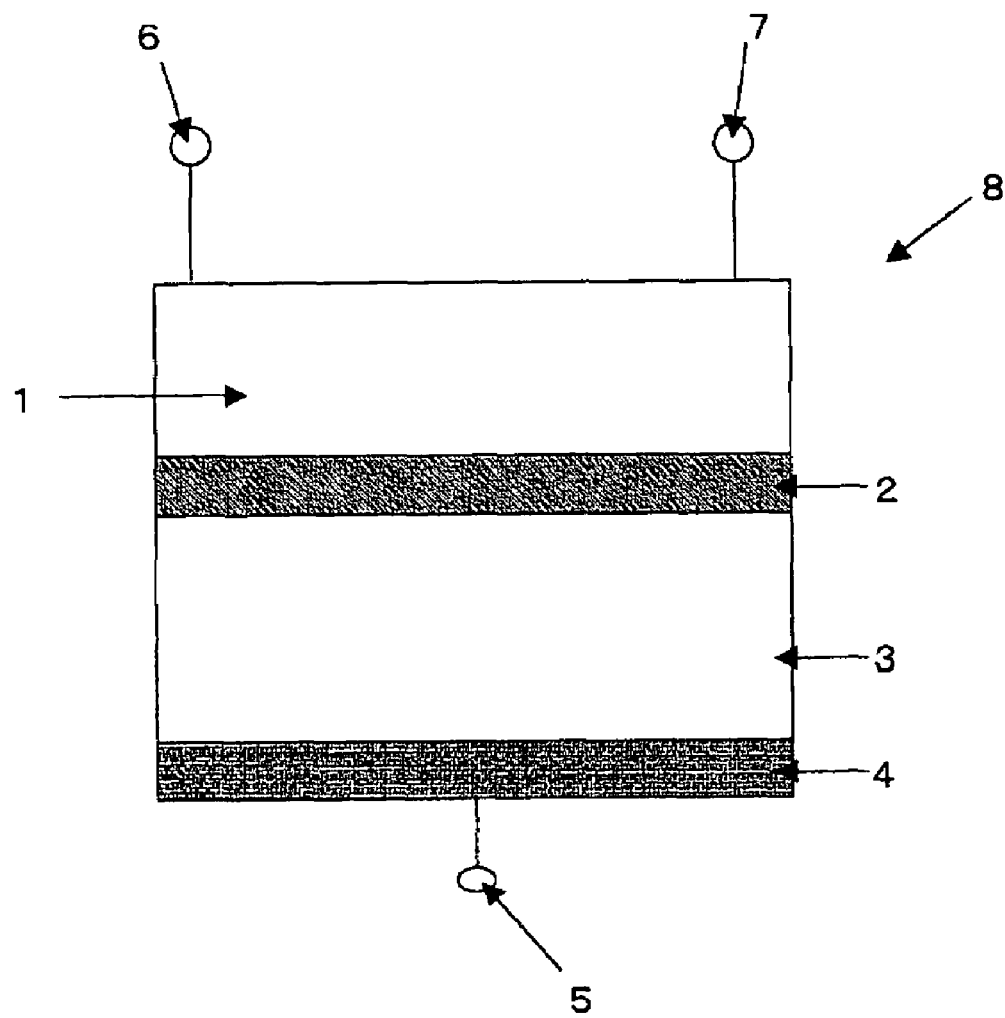
FIG. 11 is an explanatory view for explaining Pseudo MOS FET method.

As described above, in the wafer 21 that a charge is loaded or an extremely thin silicon oxide film having a uniform thickness is formed on a main surface of, the charge state in the surface becomes stable without 10 hr or more passing after the removal of a native oxide film on the main surface, and therefore, the wafer becomes suitable for an accurate evaluation of an electric characteristic. Next, the electric characteristic of the wafer 21 is evaluated by a mercury-probe evaluation apparatus 11 in the mercury probe section 19. The mercury-probe evaluation apparatus 11, for example, having a constitution as shown in FIG. 8 can be used. The mercury-probe evaluation apparatus 11 comprises a stage (not shown) for placing a wafer thereon, a vacuum chuck 32 that is also an electrode, and a mercury probe 33. In the evaluation, first, the wafer 21 transported by the wafer automatic transport part 12 is placed on the stage so that a back surface of the wafer is upward. The stage is stored in the apparatus 11 and the back surface of the wafer is sucked by vacuum chuck 32 that is also an electrode. After the wafer 21 is sucked and the stage separates from the main surface of the wafer 21, the mercury probe 33 is approached to the main surface of the wafer 21, and a mercury electrode at the end of the mercury probe 33 is contacted to the main surface of the wafer 21. In the case of seeing the mercury probe 33 from the direction of the end face thereof, the mercury electrode has a shape as shown in FIG. 9. For example, the electrode 34 is a drain electrode, and the electrode 35 is a source electrode. In addition, there is no problem if either of the electrodes 34 and 35 is a drain electrode. In this way, a Pseudo-MOS structure as shown in FIG. 11 is formed, and electric measurement is evaluated.

A constant drain voltage is applied in the state that a Pseudo-MOS structure is formed. In the state, a gate voltage is changed and the change of drain current is monitored, and thereby a relation of the gate voltage $V_G$ and the drain current $I_D$, namely, a $V_G$-$I_D$ characteristic is measured.

As described above, according to the evaluation apparatus 10 of the present invention, after the native oxide film is removed with an aqueous solution containing hydrogen fluoride, an electric characteristic of the wafer can be rapidly evaluated without storing the wafer for 10-12 hr. Therefore, the evaluation efficiency is improved. In addition, there is a significant advantage that they can be operated in one apparatus.

By the above-described procedure, an electric characteristic of the wafer 21 can be evaluated by using a mercury probe. However, if the evaluation of the wafer is continuously performed, the mercury electrode of the mercury probe adsorbs particles, metal impurities, organic impurities, and so forth that exist at a small amount on the wafer main surface. Therefore, the mercury constituting the electrode is gradually contaminated with containing impurities. Therefore, it is necessary that the mercury electrode is subjected to cleaning of the mercury in getting to a predetermined frequency of use or a predetermined contamination state. In the evaluation apparatus 10 of the present invention, the cleaning can be performed by the mercury-electrode cleaning apparatus 16 provided in the mercury probe section 19.

Figure 10:
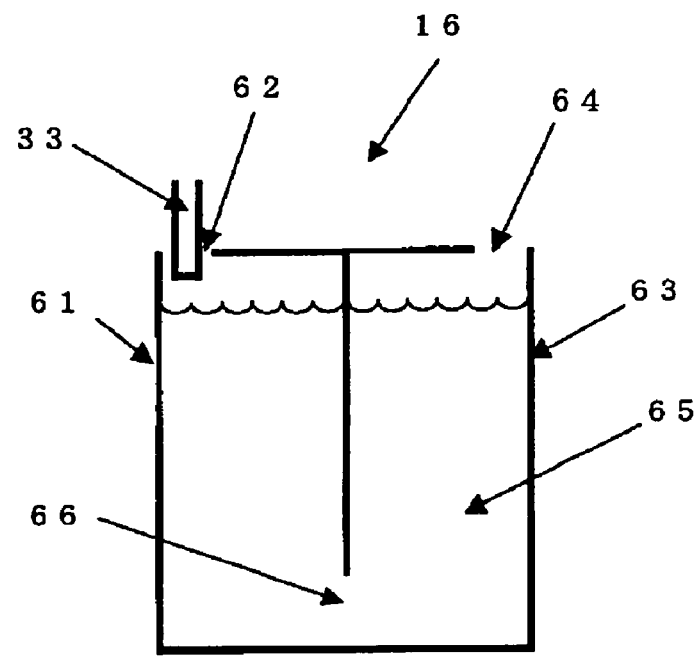
FIG. 10 is a schematic view showing an example of a constitution of a mercury-electrode cleaning apparatus.

FIG. 10 is a schematic view showing an example of a constitution of a mercury-electrode cleaning apparatus. The mercury-electrode cleaning apparatus 16 comprises mercury probe insertion holes 62, 64 and mercury tanks 61, 63. In the mercury tanks 61 and 63, mercury 65 is filled. Moreover, in a tank wall dividing the mercury tanks 61 and 63, a through-hole 66 through which the mercury can circulate in the both tanks is provided in the vicinity of the bottom thereof.

A method for cleaning a mercury electrode of the mercury probe by using such a mercury-electrode cleaning apparatus 16 will be explained. First, the mercury probe 33 as described above is inserted into the mercury probe insertion hole 62. And, the mercury probe being set in a reduced pressure state for holding the mercury in the mercury electrode portion is set in a higher pressure state than an atmospheric pressure, and thereby the mercury held in the mercury electrode portion is exhausted in the mercury tank 61. Contamination such as particles, metal impurities, or organic impurities which are adsorbed by exhausted mercury, has a lower specific density than mercury, and therefore gathers in the liquid level without sinking to the bottom in the mercury tank 61. The mercury tanks 61, 63 are divided by the tank wall and only linked through the through-hole 66 in the bottom. Therefore, the contamination stays in the mercury tank 61 and does not circulate to the side of the mercury tank 63. Therefore, the mercury 65 in the side of the mercury tank 63 is not contaminated by the contamination.

After exhaust of the mercury is ended, the mercury probe 33 is pulled out of the mercury probe insertion hole 62 and inserted into the mercury probe insertion hole 64. And, the end of the mercury probe 33 is immersed in the mercury 65 and the mercury probe 33 is set in a reduced pressure state. Thereby, the mercury that is not contaminated is refilled up to the mercury electrode portion of the mercury probe 33. In this way, cleanup of the mercury used in the mercury probe can be easily realized and accuracy of the evaluation of an electric characteristic can be held to be high. The mercury-electrode cleaning apparatus is provided in the mercury probe section in the evaluation apparatus, and therefore, the cleaning time can be shortened and the operation efficiency can be improved.

Hereinafter, the present invention will be explained in more detail with reference to Example of the present invention and Comparative example. However, it goes without saying that the present invention is not limited thereto.

EXAMPLE

As the object wafer to be evaluated, an SOI wafer produced by bonding a support wafer and a wafer to be an SOI layer, both of which are silicon wafers having a P-type conductivity type and a 200-mm diameter and a <100> crystal orientation, was used. In addition, as a dopant for setting the wafer to have P-type, boron was used. Moreover, the thickness of the SOI layer and the BOX layer were approximately 100 nm and approximately 145 nm, respectively.

The electric characteristic of the SOI wafer was measured by the evaluation apparatus of the present invention as shown in FIG. 1. First, the SOI wafer was stored in the wafer cassette and transported by the wafer automatic transport part and put in the tank of aqueous solution containing hydrogen fluoride in the hydrofluoric acid treatment apparatus, and cleaned with the aqueous solution containing 1-wt % hydrogen fluoride, and then rinsed by pure water, and then dried by removing moisture by a dry air. Next, the SOI wafer was transported by the wafer automatic transport part, and a positive charge of 3000 nC/cm$^2$ was loaded on the SOI layer by the corona charge apparatus (KG101, manufactured by SEMILAB Inc.). Then, the SOI wafer was transported by the wafer automatic transport part, and placed on the mercury-probe evaluation apparatus (CVmap92, manufactured by Four DIMENSIONS Inc.), and the $V_G$-$I_D$ characteristic in a hole side was measured. From the measured value and formulas described in the above-described documents by S. Cristoleveanu et al. and H. J. Hovel, the hole mobility and the oxide film charge density of the BOX layer were obtained, and therefore the values were 300 cm$^2$/Vs and 10×10$^{10}$/cm$^2$. The measurement by using the apparatus of the present invention was finished in approximately 2 hr and 30 min from the pretreatment to the end of the measurement. Moreover, the main surface of the SOI wafer after the measurement was ended was measured by a particle counter (Particle Counter SP1, manufactured by KLA-Tencor Inc.), and therefore eleven luminescent-spot defects of 0.1 µm or more were observed.

COMPARATIVE EXAMPLE

The same SOI wafer as Example was measured by a method by using a plurality of conventional treatment apparatuses and evaluation apparatuses. First, the SOI wafer was put in the wafer cassette and set in the hydrofluoric acid treatment apparatus placed inside a hydrofluoric acid treatment room provided for the hydrofluoric acid treatment. After the hydrofluoric acid treatment was ended under the same condition as Example, the SOI wafer was taken out by tweezers to the same corona charge apparatus as Example that is placed independently outside the evaluation apparatus, and placed on the stage therein, and the same amount of a positive charge as Example was loaded on a main surface of the SOI wafer. Then, all the same, on the same mercury probe evaluation apparatus as Example that is placed independently outside the evaluation apparatus, the SOI wafer was placed, and the $V_G$-$I_D$ characteristic in a hole side was measured. From the measured value and formulas described in the above-described documents by S. Cristoleveanu et al. and H. J. Hovel, the hole mobility and the oxide film charge density of the BOX layer were obtained, and therefore the values were 300 cm$^2$/Vs and 10×10$^{10}$/cm$^2$. The measurement by using the conventional evaluation apparatus was finished in approximately 3 hr, which is longer than that of Example. Moreover, the main surface of the SOI wafer after the measurement was ended was measured by the particle counter, and therefore 81 luminescent-spot defects of 0.1 µm or more were observed.

As described above, by using an evaluation apparatus of the present invention, the evaluation time per one wafer including the pretreatment of the wafer can be shortened. Moreover, the wafer is not transported out of the evaluation apparatus in the evaluation process, and therefore, the main surface of the wafer can be prevented from being contaminated with particles and such, and the effect thereof on the evaluation result can be prevented suitably.

The present invention is not limited to the above-described embodiments. The above-described embodiments are mere examples, and those having the substantially same constitution as that described in the appended claims and providing the similar action and advantages are included in the scope of the present invention.

INDUSTRIAL APPLICABILITY

The present invention can be used as an evaluation apparatus for evaluating an electric characteristic of a silicon single crystal wafer, an epitaxial wafer, an SOI wafer, or the like.

The invention claimed is:

1. An apparatus for evaluating a semiconductor wafer in order to evaluate an electric characteristic thereof, comprising, at least, a wafer cassette section on which a wafer cassette for storing the semiconductor wafer that is an object to be evaluated is placed, a wafer pretreatment section for pretreating the semiconductor wafer in order to evaluate the electric characteristic thereof, a mercury probe section for evaluating the electric characteristic of the semiconductor wafer by using a mercury probe, and an automatic transport part for transporting the semiconductor wafer to each of the sections.

2. The apparatus for evaluating a semiconductor wafer according to claim 1, wherein in the wafer pretreatment section, a native oxide film on a surface of the semiconductor wafer is removed as the pretreatment.

3. The apparatus for evaluating a semiconductor wafer according to claim 1, wherein in the wafer pretreatment section, a silicon oxide film is formed or a charge is loaded, on a surface of the semiconductor wafer as the pretreatment.

4. The apparatus for evaluating a semiconductor wafer according to claim 2, wherein in the wafer pretreatment section, a silicon oxide film is formed or a charge is loaded, on a surface of the semiconductor wafer as the pretreatment.

5. The apparatus for evaluating a semiconductor wafer according to claim 1, wherein the mercury probe section has a mercury-electrode cleaning means for cleaning a mercury electrode of the mercury probe.

6. The apparatus for evaluating a semiconductor wafer according to claim 2, wherein the mercury probe section has a mercury-electrode cleaning means for cleaning a mercury electrode of the mercury probe.

7. The apparatus for evaluating a semiconductor wafer according to claim 3, wherein the mercury probe section has a mercury-electrode cleaning means for cleaning a mercury electrode of the mercury probe.

8. The apparatus for evaluating a semiconductor wafer according to claim 4, wherein the mercury probe section has a mercury-electrode cleaning means for cleaning a mercury electrode of the mercury probe.

9. The apparatus for evaluating a semiconductor wafer according to claim 1, wherein the wafer pretreatment section has a hydrofluoric acid treatment apparatus.

10. The apparatus for evaluating a semiconductor wafer according to claim 2, wherein the wafer pretreatment section has a hydrofluoric acid treatment apparatus.

11. The apparatus for evaluating a semiconductor wafer according to claim 3, wherein the wafer pretreatment section has a hydrofluoric acid treatment apparatus.

12. The apparatus for evaluating a semiconductor wafer according to claim 4, wherein the wafer pretreatment section has a hydrofluoric acid treatment apparatus.

13. The apparatus for evaluating a semiconductor wafer according to claim 5, wherein the wafer pretreatment section has a hydrofluoric acid treatment apparatus.

14. The apparatus for evaluating a semiconductor wafer according to claim 6, wherein the wafer pretreatment section has a hydrofluoric acid treatment apparatus.

15. The apparatus for evaluating a semiconductor wafer according to claim 7, wherein the wafer pretreatment section has a hydrofluoric acid treatment apparatus.

16. The apparatus for evaluating a semiconductor wafer according to claim 8, wherein the wafer pretreatment section has a hydrofluoric acid treatment apparatus.

17. The apparatus for evaluating a semiconductor wafer according to claim 1, wherein the wafer pretreatment section has at least one of, a corona charge apparatus, a wafer heating apparatus, an ultraviolet irradiation apparatus, and a wafer cleaning apparatus.

18. The apparatus for evaluating a semiconductor wafer according to claim 2, wherein the wafer pretreatment section has at least one of, a corona charge apparatus, a wafer heating apparatus, an ultraviolet irradiation apparatus, and a wafer cleaning apparatus.

19. The apparatus for evaluating a semiconductor wafer according to claim 3, wherein the wafer pretreatment section has at least one of, a corona charge apparatus, a wafer heating apparatus, an ultraviolet irradiation apparatus, and a wafer cleaning apparatus.

20. The apparatus for evaluating a semiconductor wafer according to claim 4, wherein the wafer pretreatment section has at least one of, a corona charge apparatus, a wafer heating apparatus, an ultraviolet irradiation apparatus, and a wafer cleaning apparatus.

21. The apparatus for evaluating a semiconductor wafer according to claim 5, wherein the wafer pretreatment section has at least one of, a corona charge apparatus, a wafer heating apparatus, an ultraviolet irradiation apparatus, and a wafer cleaning apparatus.

22. The apparatus for evaluating a semiconductor wafer according to claim 6, wherein the wafer pretreatment section has at least one of, a corona charge apparatus, a wafer heating apparatus, an ultraviolet irradiation apparatus, and a wafer cleaning apparatus.

23. The apparatus for evaluating a semiconductor wafer according to claim 7, wherein the wafer pretreatment section has at least one of, a corona charge apparatus, a wafer heating apparatus, an ultraviolet irradiation apparatus, and a wafer cleaning apparatus.

24. The apparatus for evaluating a semiconductor wafer according to claim 8, wherein the wafer pretreatment section has at least one of, a corona charge apparatus, a wafer heating apparatus, an ultraviolet irradiation apparatus, and a wafer cleaning apparatus.

25. The apparatus for evaluating a semiconductor wafer according to claim 9, wherein the wafer pretreatment section has at least one of, a corona charge apparatus, a wafer heating apparatus, an ultraviolet irradiation apparatus, and a wafer cleaning apparatus.

26. The apparatus for evaluating a semiconductor wafer according to claim 10, wherein the wafer pretreatment section has at least one of, a corona charge apparatus, a wafer heating apparatus, an ultraviolet irradiation apparatus, and a wafer cleaning apparatus.

27. The apparatus for evaluating a semiconductor wafer according to claim 11, wherein the wafer pretreatment section has at least one of, a corona charge apparatus, a wafer heating apparatus, an ultraviolet irradiation apparatus, and a wafer cleaning apparatus.

28. The apparatus for evaluating a semiconductor wafer according to claim 12, wherein the wafer pretreatment section has at least one of, a corona charge apparatus, a wafer heating apparatus, an ultraviolet irradiation apparatus, and a wafer cleaning apparatus.

29. The apparatus for evaluating a semiconductor wafer according to claim 13, wherein the wafer pretreatment section has at least one of, a corona charge apparatus, a wafer heating apparatus, an ultraviolet irradiation apparatus, and a wafer cleaning apparatus.

30. The apparatus for evaluating a semiconductor wafer according to claim 14, wherein the wafer pretreatment section has at least one of, a corona charge apparatus, a wafer heating apparatus, an ultraviolet irradiation apparatus, and a wafer cleaning apparatus.

31. The apparatus for evaluating a semiconductor wafer according to claim 15, wherein the wafer pretreatment section has at least one of, a corona charge apparatus, a wafer heating apparatus, an ultraviolet irradiation apparatus, and a wafer cleaning apparatus.

32. The apparatus for evaluating a semiconductor wafer according to claim 16, wherein the wafer pretreatment section has at least one of, a corona charge apparatus, a wafer heating apparatus, an ultraviolet irradiation apparatus, and a wafer cleaning apparatus.

33. The apparatus for evaluating a semiconductor wafer according to claim 9, wherein by the hydrofluoric acid treatment apparatus, a hydrofluoric acid treatment with hydrofluoric acid, a cleaning treatment with pure water or heated pure water, and a subsequent drying treatment,eaa-be- are performed.

34. The apparatus for evaluating a semiconductor wafer according to claim 32, wherein by the hydrofluoric acid treatment apparatus, a hydrofluoric acid treatment with hydrofluoric acid, a cleaning treatment with pure water or heated pure water, and a subsequent drying treatment,-ean-be are performed.

35. The apparatus for evaluating a semiconductor wafer according to claim 17, wherein the wafer cleaning apparatus has at least one tank of, a treatment tank of ozone water, a treatment tank of aqueous solution containing ammonium and hydrogen peroxide, a treatment tank of hydrogen peroxide solution, a treatment tank of aqueous solution containing hydrogen chloride and hydrogen peroxide, a treatment tank of aqueous solution containing sulfuric acid and hydrogen peroxide, and a treatment tank of oxidizing aqueous solution containing oxidizing aqueous solution.

36. The apparatus for evaluating a semiconductor wafer according to claim 34, wherein the wafer cleaning apparatus has at least one tank of, a treatment tank of ozone water, a treatment tank of aqueous solution containing ammonium and hydrogen peroxide, a treatment tank of hydrogen peroxide solution, a treatment tank of aqueous solution containing hydrogen chloride and hydrogen peroxide, a treatment tank of aqueous solution containing sulfuric acid and hydrogen peroxide, and a treatment tank of oxidizing aqueous solution containing oxidizing aqueous solution.

37. The apparatus for evaluating a semiconductor wafer according to claim 35, wherein the oxidizing aqueous solution is electrolyzed anode water.

38. The apparatus for evaluating a semiconductor wafer according to claim 36, wherein the oxidizing aqueous solution is electrolyzed anode water.

* * * * *